(12) United States Patent
Li et al.

(10) Patent No.: US 11,296,096 B2
(45) Date of Patent: *Apr. 5, 2022

(54) ANTIFUSE OTP STRUCTURE WITH HYBRID JUNCTIONS

(71) Applicant: Zhuhai Chuangfeixin Technology Co., Ltd., Zhuhai (CH)

(72) Inventors: Li Li, Femont, CA (US); Zhigang Wang, Fremont, CA (US)

(73) Assignee: Zhuhai Chuangfeixin Technology Co., Ltd., Zhuhai (CN)

( * ) Notice: Subject to any disclaimer, the term of this patent is extended or adjusted under 35 U.S.C. 154(b) by 203 days.

This patent is subject to a terminal disclaimer.

(21) Appl. No.: 16/678,051

(22) Filed: Nov. 8, 2019

(65) Prior Publication Data

US 2021/0143161 A1  May 13, 2021

(51) Int. Cl.
  *H01L 27/112*  (2006.01)
  *H01L 23/535*  (2006.01)
  *H01L 23/525*  (2006.01)

(52) U.S. Cl.
  CPC ...... *H01L 27/11206* (2013.01); *H01L 23/535* (2013.01); *H01L 23/5252* (2013.01)

(58) Field of Classification Search
  CPC .............. H01L 27/11206; H01L 23/535; H01L 23/5252
  See application file for complete search history.

(56) References Cited

U.S. PATENT DOCUMENTS

| | | | | |
|---|---|---|---|---|
| 5,141,890 A | * | 8/1992 | Haken | H01L 21/02238 438/231 |
| 5,163,180 A | * | 11/1992 | Eltoukhy | H01L 23/5252 257/408 |
| 6,667,902 B2 | | 12/2003 | Peng | |
| 6,671,040 B2 | | 12/2003 | Fong | |
| 6,798,693 B2 | | 9/2004 | Peng | |
| 6,822,888 B2 | | 11/2004 | Peng | |
| 7,402,855 B2 | | 7/2008 | Kurjanowiez | |
| 8,283,751 B2 | | 10/2012 | Kurjanowicz | |
| 8,384,155 B2 | * | 2/2013 | Lin | H01L 27/112 257/347 |
| 9,224,496 B2 | * | 12/2015 | Chung | G11C 17/12 |
| 9,601,499 B2 | * | 3/2017 | Wu | H01L 29/7833 |
| 10,090,309 B1 | * | 10/2018 | Chen | G11C 7/22 |
| 10,446,562 B1 | * | 10/2019 | Horch | H01L 29/0847 |
| 11,018,143 B1 | * | 5/2021 | Li | H01L 21/266 |
| 2003/0198085 A1 | * | 10/2003 | Peng | G11C 17/16 365/185.12 |
| 2008/0175060 A1 | * | 7/2008 | Liu | H01L 29/7841 365/185.18 |
| 2009/0115021 A1 | * | 5/2009 | Moriwaki | H01L 27/0203 257/530 |

(Continued)

FOREIGN PATENT DOCUMENTS

CN        104681558 A      6/2015

*Primary Examiner* — Eugene Lee
(74) *Attorney, Agent, or Firm* — SV Patent Service

(57) ABSTRACT

An antifuse One-Time-Programmable memory cell includes a substrate, a select transistor, and an antifuse capacitor. The select transistor includes a first high-voltage junction formed in the substrate and a first low-voltage junction formed in the substrate. The antifuse capacitor includes a second high-voltage junction formed in the substrate and a second low-voltage junction formed in the substrate.

15 Claims, 9 Drawing Sheets

(56) References Cited

U.S. PATENT DOCUMENTS

| | | | |
|---|---|---|---|
| 2012/0008364 A1* | 1/2012 | Lai .......................... | G11C 17/16 |
| | | | 365/103 |
| 2014/0098591 A1* | 4/2014 | Chen ................. | H01L 27/11206 |
| | | | 365/96 |
| 2014/0340955 A1* | 11/2014 | Wu ................... | H01L 27/11206 |
| | | | 365/104 |
| 2015/0287730 A1* | 10/2015 | Wu ........................ | G11C 16/26 |
| | | | 365/96 |
| 2017/0076757 A1* | 3/2017 | Wu ........................ | G11C 17/16 |
| 2017/0301406 A1* | 10/2017 | Wong ..................... | G11C 16/14 |

* cited by examiner

ANTIFUSE OTP STRUCTURE WITH HYBRID JUNCTIONS

BACKGROUND OF THE INVENTION

The present invention relates to the technical field of semiconductor memory, and in particular, to One Time Programmable (OTP) memory.

Embedded Non-Volatile Memory (ENVM) technology has been employed in a number of applications such as post silicon tuning, memory repair, on-line field test, and secure ID storage. ENVM is also a critical component for self-healing applications in which information regarding time dependent failure mechanisms such as circuit aging must be retained during system power off periods. Anti-Fuse One Time Programmable (AF-OTP) NVM memory has been extensively used for memory repair in standard logic processes.

An antifuse is non-conductive in the native unprogrammed state and becomes conductive when programmed, hence the name antifuse. In integrated circuit, antifuse is commonly constructed with a thin dielectric layer sandwiched between two conductors. To program an antifuse, a high voltage is applied between the two conductors. This leads to a physical and permanent breakdown of the thin dielectric layer and the formation of a current conduction path between the two conductors. Antifuse can thus be used as a memory element. Programmed state of an antifuse represents data "1" and unprogrammed state "0" or vice versa. Once programmed, antifuse memory cannot revert to unprogrammed state, i.e., it is a one-time programmable (OTP) memory. Antifuse retains conductive or non-conductive state even after the power is turned off, rendering the data non-volatile. As such, antifuse memory is a non-volatile OTP memory.

In order to provide a high voltage to program the antifuse capacitor, the select transistor is usually built with high voltage junctions. However, transistor with high voltage junctions will take more silicon area because wider channel length and width are needed, and the more silicon area will directly correlate to higher cost. On the other hand, the antifuse capacitor is usually built with thinner gate dielectric for easier programming.

There is therefore a need for antifuse OTP memory with higher integration density and higher programming yield.

SUMMARY OF THE INVENTION

In view of the above, the present disclosure provides an antifuse OTP memory bit cell that includes an antifuse capacitor and a metal-oxide-semiconductor field-effect-transistor (MOSFET). The MOSFET is a select transistor which is implemented to program or access the antifuse capacitor. A novel hybrid high voltage/low voltage junction of the select transistor is provided in this invention for both high voltage programming and smaller silicon area. A novel hybrid high voltage/low voltage junction of antifuse capacitor is provided to improve programming yield.

In one general aspect, the present invention relates to an antifuse One-Time-Programmable memory cell, which includes: a substrate, a select transistor formed on the substrate, wherein the select transistor includes a first gate dielectric layer formed on the substrate, a first gate formed on the gate dielectric layer, a first high-voltage junction formed in the substrate, and a first low-voltage junction formed in the substrate, wherein a source and a drain for the select transistor are respectively formed the first high-voltage junction and the first low-voltage junction, or respectively formed by the first low-voltage junction and the first high-voltage junction, and an antifuse capacitor formed on the substrate, wherein the antifuse capacitor includes a second gate dielectric layer formed on the substrate, a second gate formed on the gate dielectric layer, a second high-voltage junction formed in the substrate, and a second low-voltage junction formed in the substrate, wherein a source and a drain for the antifuse capacitor are respectively formed the second high-voltage junction and the second low-voltage junction, or respectively formed by the second low-voltage junction and the second high-voltage junction.

Implementations of the system may include one or more of the following. The first high-voltage junction or the second high-voltage junction can have a threshold junction breakdown voltage above 3.3 Volt. The first high-voltage junction or the second high-voltage junction can have a threshold junction breakdown voltage above 5 Volt. The first low-voltage junction or the second low-voltage junction can have a threshold junction breakdown voltage below 3.2 Volt. The first low-voltage junction or the second low-voltage junction can have a threshold junction breakdown voltage below 2.3 Volt. The first high-voltage junction and the second high-voltage junction can be electrically connected. At least one of the first high-voltage junction or the second high-voltage junction can include two doped regions having different doping levels. The first high-voltage junction can include a first doped region adjacent to the first gate dielectric layer at a lower doped level than a second doped region away from the first gate dielectric layer. The second high-voltage junction can include a first doped region adjacent to the second gate dielectric layer at a lower doped level than a second doped region away from the second gate dielectric layer. One of the two doped regions can have an electrically active concentration of dopant level in a range of $3 \times 10^{17} \sim 1 \times 10^{19}$ atoms/cm$^{-3}$, wherein another one of the two doped regions has an electrically active concentration of dopant level above $2 \times 10^{19}$ atoms/cm$^{-3}$. At least one of the first low-voltage junction or the second low-voltage junction can include two doped regions having different doping levels. The first low-voltage junction can include a first doped region adjacent to the first gate dielectric layer at a lower doped level than a second doped region away from the first gate dielectric layer. The second low-voltage junction can include a first doped region adjacent to the second gate dielectric layer at a lower doped level than a second doped region away from the second gate dielectric layer. One of the two doped regions can have an electrically active concentration of dopant level in a range of $3 \times 10^{17} \sim 1 \times 10^{19}$ atoms/cm$^{-3}$, wherein another one of the two doped regions has an electrically active concentration of dopant level above $2 \times 10^{19}$ atoms/cm$^{-3}$.

In another general aspect, the present invention relates to an antifuse One-Time-Programmable memory cell which includes a substrate; a select transistor formed on the substrate, wherein the select transistor includes a first gate dielectric layer formed on the substrate, a first gate formed on the gate dielectric layer, a first high-voltage junction formed in the substrate, and a first low-voltage junction formed in the substrate, wherein a source and a drain for the select transistor are respectively formed the first high-voltage junction and the first low-voltage junction, or respectively formed by the first low-voltage junction and the first high-voltage junction; and an antifuse capacitor formed on the substrate, wherein the antifuse capacitor includes a second gate dielectric layer formed on the substrate, a second gate formed on the gate dielectric layer, a second low-voltage junction formed in the substrate, and a third low-voltage junction formed in the substrate, wherein a source and a drain for the antifuse capacitor are respectively formed the second low-voltage junction and the third low-voltage junction, or respectively formed by the third low-voltage junction and the second low-voltage junction.

Implementations of the system may include one or more of the following. The first high-voltage junction can have a threshold junction voltage above 3.3 Volt. The first high-voltage junction can have a threshold junction voltage above 5 Volt. The first low-voltage junction, or the second low-voltage junction, or the third low-voltage junction can have a threshold junction voltage below 3.2 Volt. The first low-voltage junction, or the second low-voltage junction, or the third low-voltage junction can have a threshold junction voltage below 2.3 Volt. The first high-voltage junction and the second low-voltage junction can be electrically connected. The first high-voltage junction can include a first doped region adjacent to the first gate dielectric layer at a lower doped level than a second doped region away from the first gate dielectric layer. The first doped region can have an electrically active concentration of dopant level in a range of $3 \times 10^{17} \sim 1 \times 10^{19}$ atoms/cm$^{-3}$, wherein the second doped region has an electrically active concentration of dopant level above $2 \times 10^{19}$ atoms/cm$^{-3}$.

In another general aspect, the present invention relates to an antifuse One-Time-Programmable memory cell, that includes a substrate; a select transistor formed on the substrate, wherein the select transistor includes: a first gate dielectric layer formed on the substrate, a first gate formed on the gate dielectric layer, a first high-voltage junction formed in the substrate, and a second high-voltage junction formed in the substrate, wherein a source and a drain for the select transistor are respectively formed the first high-voltage junction and the second high-voltage junction, or respectively formed by the second high-voltage junction and the first high-voltage junction; and an antifuse capacitor formed on the substrate, wherein the antifuse capacitor includes a second gate dielectric layer formed on the substrate, a second gate formed on the gate dielectric layer, a third high-voltage junction formed in the substrate, and a first low-voltage junction formed in the substrate, wherein a source and a drain for the antifuse capacitor are respectively formed the third high-voltage junction and the first low-voltage junction, or respectively formed by the first low-voltage junction and the third high-voltage junction.

Implementations of the system may include one or more of the following. The first high-voltage junction, or the second high-voltage junction, or the third high-voltage junction can have a threshold junction voltage above 3.3 Volt. The first high-voltage junction, or the second high-voltage junction, or the third high-voltage junction can have a threshold junction voltage above 5 Volt. The first low-voltage junction can have a threshold junction voltage below 3.2 Volt. The first low-voltage junction can have a threshold junction voltage below 2.3 Volt. The first high-voltage junction or the second high-voltage junction can include a first doped region adjacent to the first gate dielectric layer at a lower doped level than a second doped region away from the first gate dielectric layer. The first doped region can have an electrically active concentration of dopant level in a range of $3 \times 10^{17} \sim 1 \times 10^{19}$ atoms/cm$^{-3}$, wherein the second doped region can have an electrically active concentration of dopant level above $2 \times 10^{19}$ atoms/cm$^{-3}$. The third high-voltage junction can include a first doped region adjacent to the second gate dielectric layer at a lower doped level than a second doped region away from the second gate dielectric layer. The first doped region can have an electrically active concentration of dopant level in a range of $3 \times 10^{17} \sim 1 \times 10^{19}$ atoms/cm$^{-3}$, wherein the second doped region has an electrically active concentration of dopant level above $2 \times 10^{19}$ atoms/cm$^{-3}$.

These and other aspects, their implementations and other features are described in detail in the drawings, the description and the claims.

BRIEF DESCRIPTION OF THE DRAWINGS

To illustrate the technical solutions of the present invention, the accompanying drawings briefly described embodiments need to be used in describing the embodiments. Obviously, the following drawings only describe examples of the present invention. For those skilled in the art, other drawings may also be obtained according to these drawings without any creative work.

DETAILED DESCRIPTION OF THE INVENTION

The following clearly and completely describes the technical solutions in the embodiments of the present invention with reference to the accompanying drawings in the embodiments of the present invention. Apparently, the described embodiments are merely some but not all of the embodiments of the present invention. Based on the embodiments of the present invention, those of ordinary skill in the art that do not record all the other work under the premise of making the solid obtained in embodiments, are within the scope of protection of the present invention.

Figure 2A:
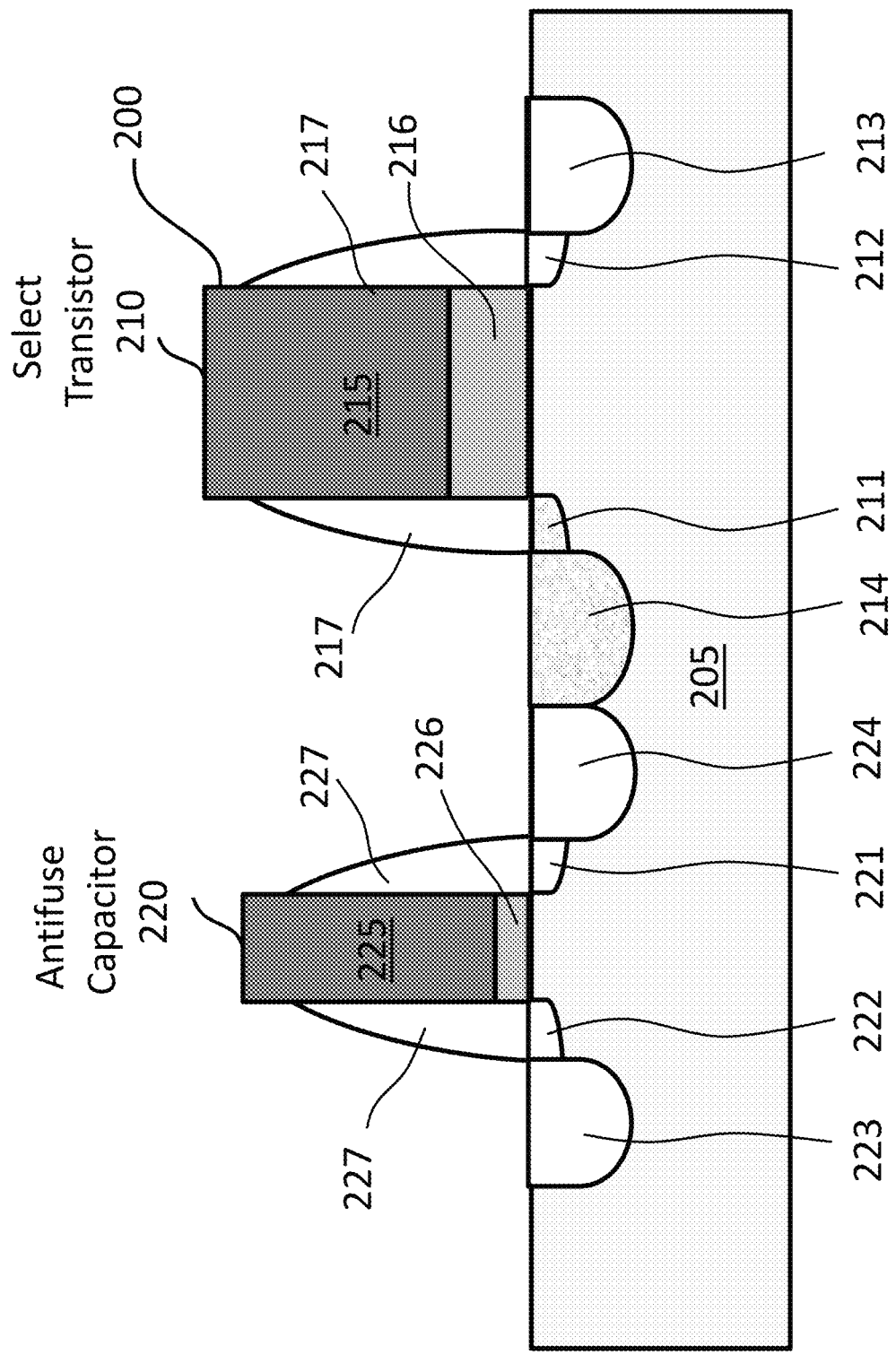
FIG. 2A is a cross-sectional view of a one-transistor one-capacitor (1T1C) antifuse OTP memory cell in accordance with some embodiments of the present invention.
Figure 2B:
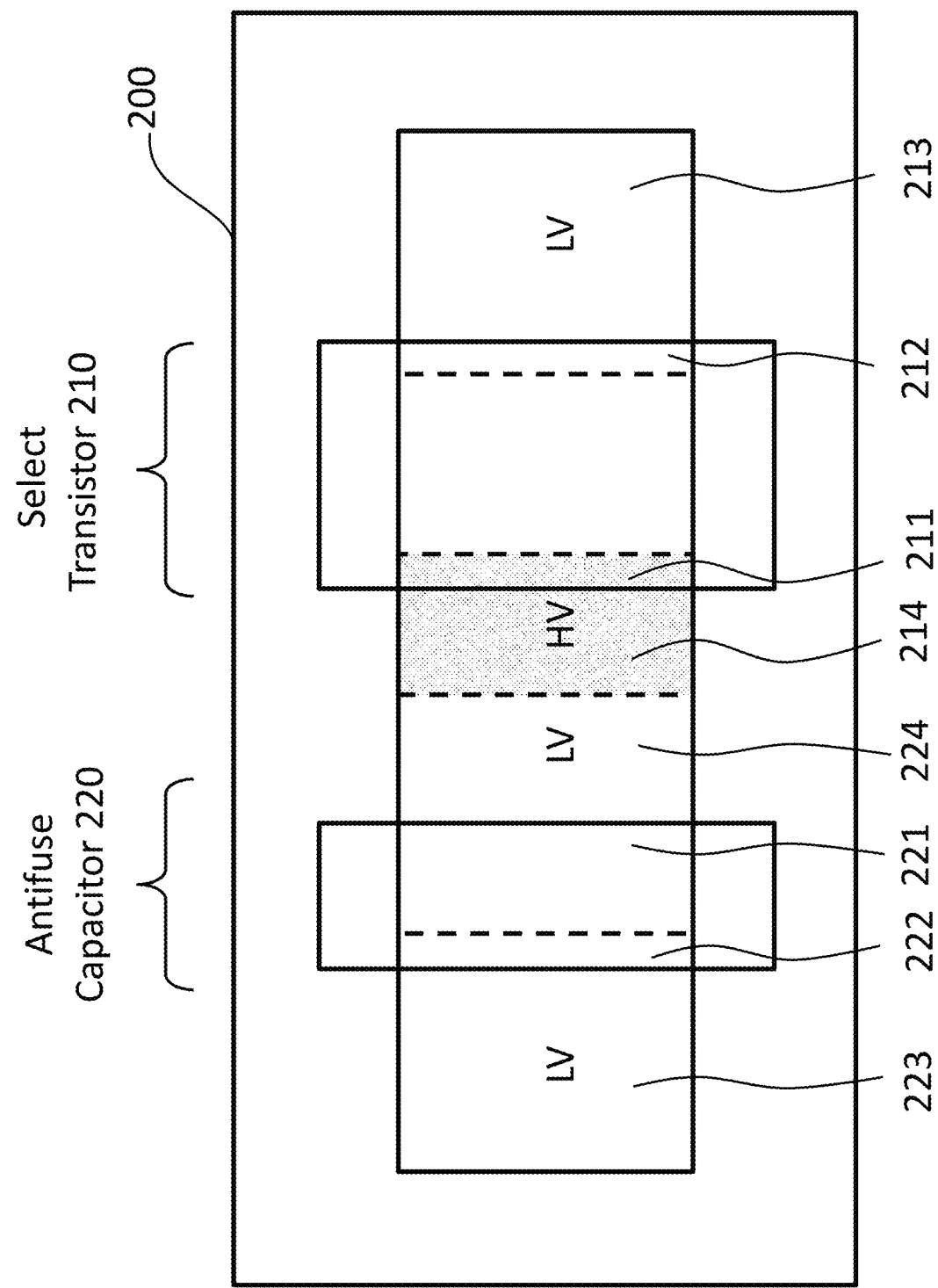
FIG. 2B is a schematic drawing of the one-transistor one-capacitor (1T1C) antifuse OTP memory cell shown in FIG. 2A.

In some embodiments, the antifuse OTP memory uses metal-oxide-semiconductor (MOS) capacitor as the antifuse element. The MOS capacitor is connected to an access device called select transistor, typically a metal-oxide-semiconductor field-effect-transistor (MOSFET) to form a one-transistor one-capacitor (1T1C) antifuse memory bit cell. Referring to FIGS. 2A-2B, a one-transistor one-capacitor (1T1C) antifuse OTP memory cell 100 includes a select transistor 110 and an antifuse capacitor 120. The select transistor 110 includes a gate 115 on a gate dielectric 116 on a substrate 105. The antifuse capacitor 120 includes a gate 125 on a gate dielectric 126 on the substrate 105. The junctions (e.g. the source or the drain) of the select transistor 110 are formed respectively by lightly doped regions 111, 112 and the deeply doped regions 113, 114. The junctions (e.g. source or drain) of the antifuse capacitor 120 are formed respectively by lightly doped regions 121, 122 and the deeply doped regions 123, 124.

The combination of lightly doped regions 111, 112 and 121, 122 and deeply doped regions 113, 114 and 123, 124 is formed as the source/drain regions on both sides of the channel by applying the spacer structure 117, 127 between two doping processes.

The source/drain and the gates 115, 125 of the antifuse capacitor 120 and select transistor 110 are of the same conductivity type. The transistor channel region, i.e., the silicon substrate 105 underneath gate dielectric is of the opposite conductivity type. In the select transistor 110, for example, if the gate 115 and source/drain respectively formed by doped regions 111, 114 and doped regions 112, 113 are N type, the regions of the substrate 105 underneath the gate dielectric 116 is P type. Thus, the source/drain regions form PN junctions with the oppositely doped silicon substrate 105. Similarly, for the antifuse capacitor 120, if the gate 125 and source/drain respectively formed by doped regions 121, 124 and 122, 123 are N type, the region of the substrate 105 underneath the gate dielectric 126 is P type.

The doped regions 111, 112 and 121, 122 are lightly doped, wherein the electrically active concentration of dopant level can be in a range of $3\times10^{17}\sim1\times10^{19}$ atoms/cm$^{-3}$. The doped regions 113, 114 and 123, 124 formed on both sides of the channels are deeply doped, wherein the electrically active concentration of dopant level can be above $2\times10^{19}$ atoms/cm$^{-3}$.

Doped regions of 113, 112 are connected, and they are electrically conductive. Similarly, doping regions of 111, 114, 124, and 121 are connected, and they are electrically conductive. During antifuse programming, a voltage is applied on the gate 115 to turn on the select transistor 110, i.e., to form a conductive channel in the substrate 105 underneath the gate dielectric 116. Meantime, a programming voltage is applied to the doped region 113. Through the conductive path, this programming voltage is actually applied on the gate dielectric 126 to cause a dielectric breakdown. A low electrical resistance will be measured between the gate 125 and the doping region 124.

Doped regions 111 and 114 form a high-voltage (HV) junction with the substrate 105 for the select transistor 110. The junction breakdown threshold voltage can be higher than 3.3V, or higher than 5V depending on technology node of the device. Doped regions 112 and 113 form a low-voltage (LV) junction with the substrate 105 for the select transistor 110. The junction breakdown threshold voltage for an LV junction can be lower than 3.2V, or below 2.3V depending on technology node of the device. Doped regions 121 and 124 form a HV junction with the substrate 105 for the antifuse capacitor 120. Doped regions 122 and 123 form LV junction with the substrate 105 for the antifuse capacitor 120.

In order for transistor to function normally, the junction bias needs to be below junction breakdown voltage. For low voltage transistor, a shallower and steeper junction can be used without causing breakdown. Thus the device can have better short-channel behaviors. Formation of this kind of junction requires shallower implants, lower temperature and shorter anneals. For high voltage transistor, it is critical to avoid a peak junction electric field that may cause breakdown; therefore the junction profile must be adjusted accordingly. To avoid introducing a very high peak field at the junction, more gradual junction doping profiles are preferred. This usually means deeper implants, longer (maybe multiple) annealing steps. This kind of junctions consequently can handle higher bias voltages.

Figure 1A:
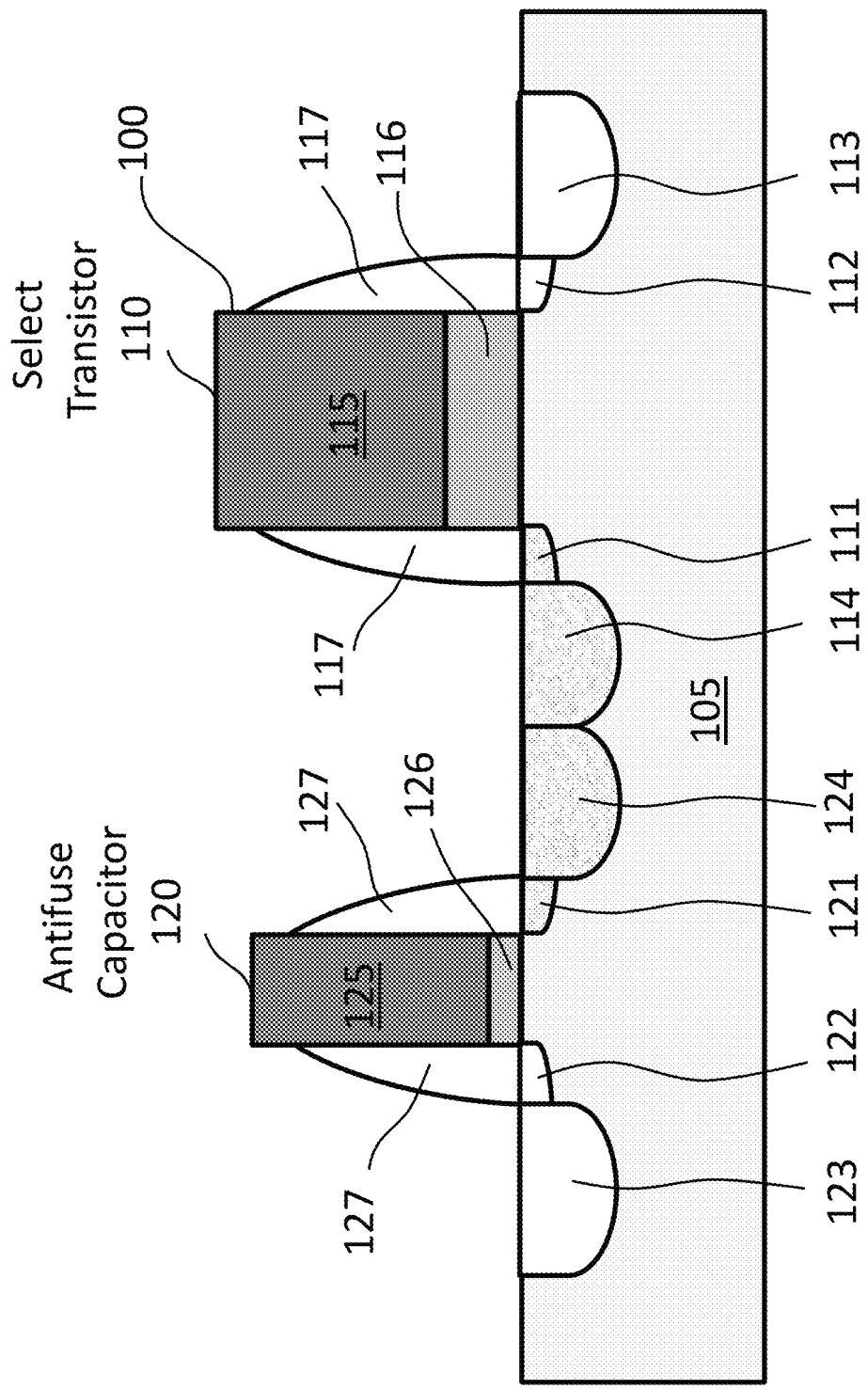
FIG. 1A is a cross-sectional view of a one-transistor one-capacitor (1T1C) antifuse OTP memory cell in accordance with some embodiments of the present invention.
Figure 1B:
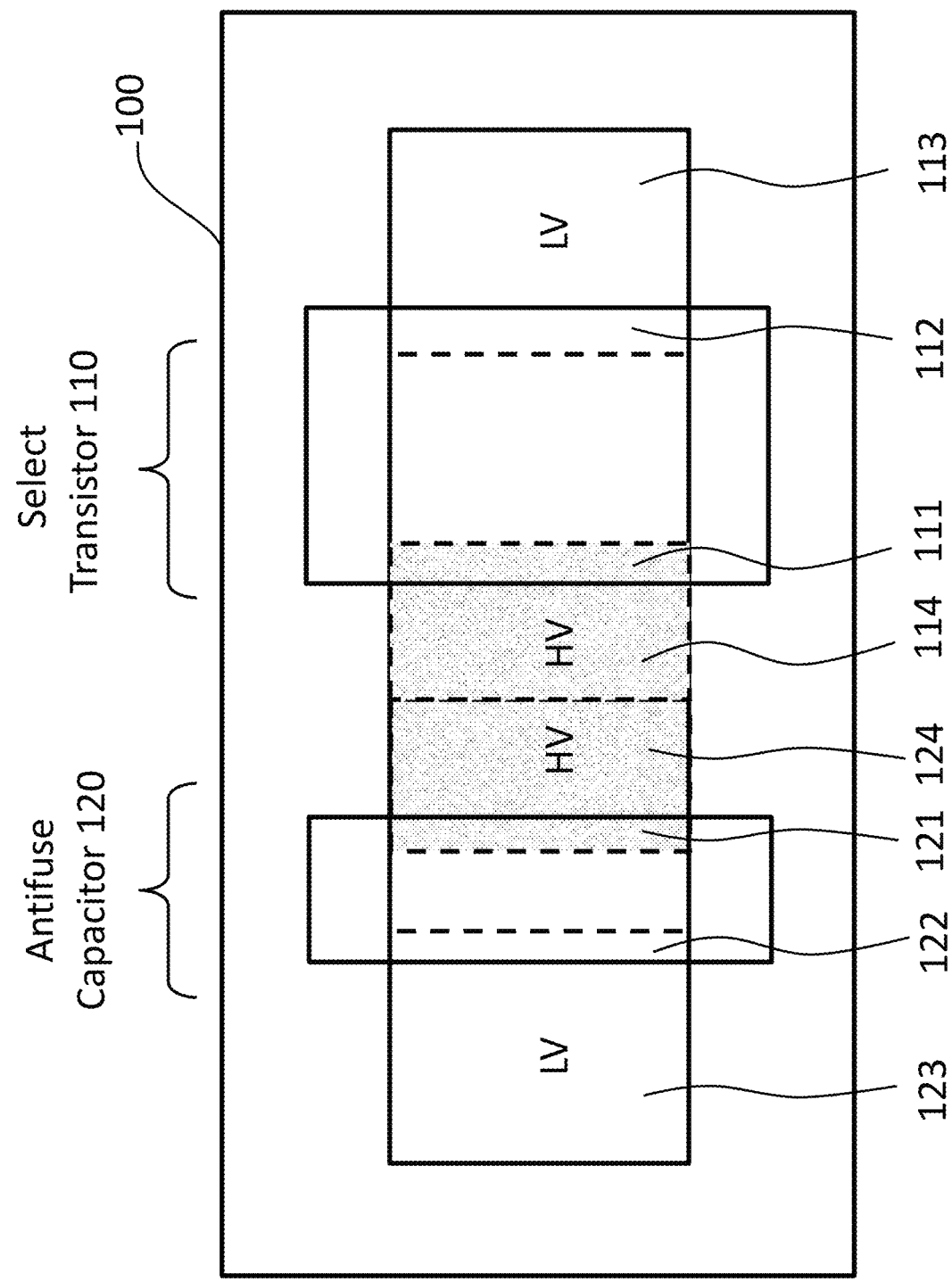
FIG. 1B is a schematic drawing of the one-transistor one-capacitor (1T1C) antifuse OTP memory cell shown in FIG. 1A.
Figure 1C:
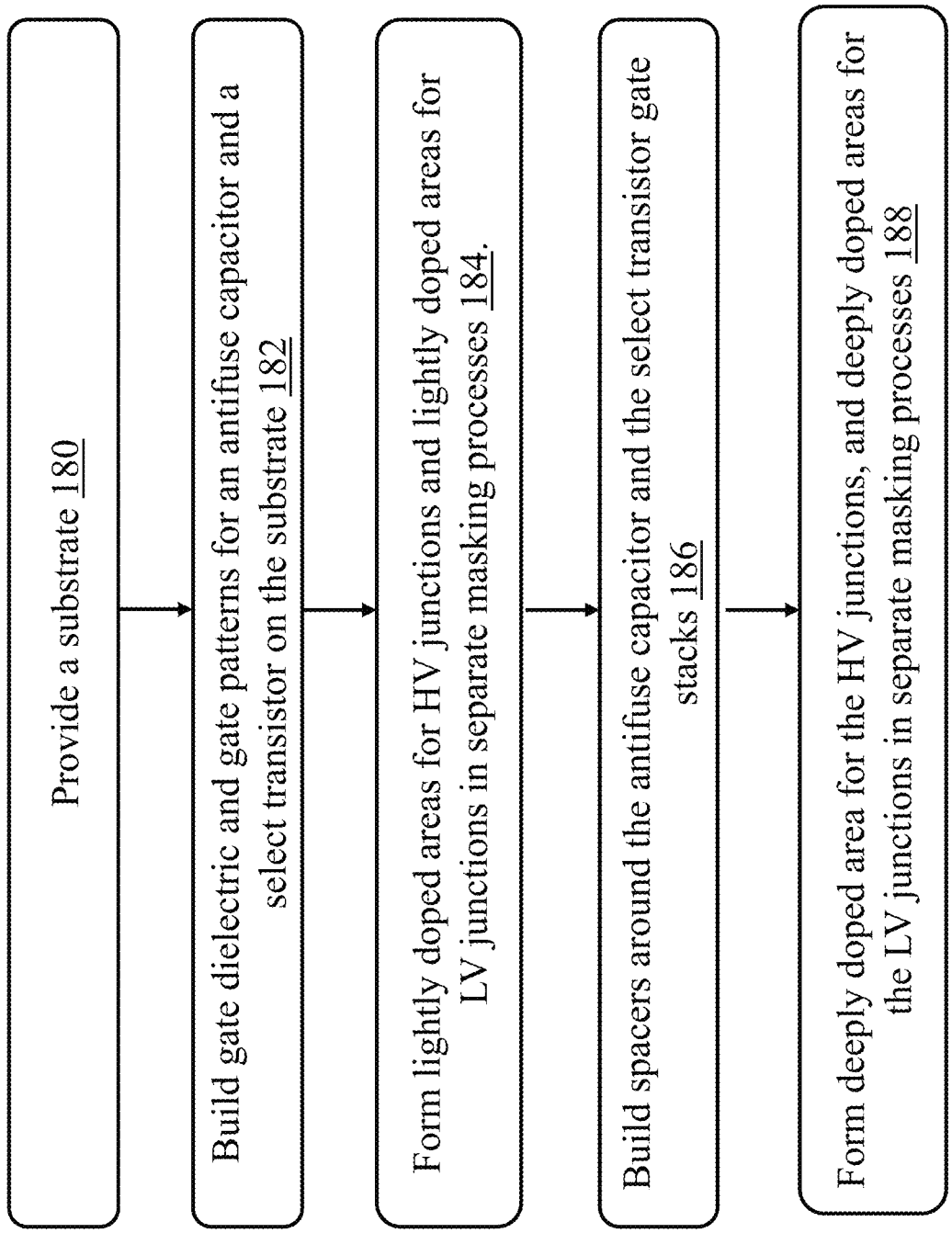
FIG. 1C is a process flow chart to build the one-transistor one-capacitor (1T1C) antifuse OTP memory cell shown in FIG. 1A.

Referring to FIG. 1C, a process to build the one-transistor one-capacitor (1T1C) antifuse OTP memory cell 100 can include the following steps. First to grow gate dielectric on a substrate (step 180). Gate dielectric and gate patterns for an antifuse capacitor and a select transistor on the substrate (step 182). A thin gate dielectric layer is formed on the substrate for the antifuse capacitor and a thicker gate dielectric layer is formed on the substrate for the select transistor. Then, the gate stacks are formed on top of the gate dielectric layers respectively. The antifuse capacitor and the select transistor are defined by masking and etching. The combination of lightly doped regions and deeply doped regions is formed by applying the spacer structure 117, 127 between two doping processes.

The relatively shallow doping regions (e.g. 111, 121 in FIGS. 1A and 1B) for HV junction and the relatively shallow doping regions (e.g. 112, 122 in FIGS. 1A and 1B) for LV junctions are formed through separate masking and ion implants (step 184). As described above, annealing steps maybe added after dopant implant process, which can be tailored to form HV and LV junctions.

Building spacers around antifuse capacitor and select transistor gate stacks (step 186). Deeply doped region (114 and 124 in FIGS. 1A and 1B) for the HV junctions, and deeply doped regions (113, 123 in FIGS. 1A and 1B) for the LV junctions are formed in separate masking processes and ion implants (step 188).

In steps 182-188, the hybrid source and drain junctions can be formed in two step using different implantation conditions. For example, the more graduate junction can be first implanted using a high-voltage setting, followed by an implantation for the low-voltage junction setting. Two masking steps are needed, each exposing only one side of the source or the drain to the appropriate implantation. If necessary, an additional anneal can be added between the two implants. A possible sequence can be: mask the drain side→HV implant→anneal (optional)→mask the source side→low voltage implant→anneal.

The above described only serves as an example of process critical process steps to build a one-transistor one-capacitor (1T1C) antifuse OTP memory cell shown in FIGS. 1A-1B. Additional process steps maybe included between processes steps described above, and many process steps are needed before and after the processes steps described above for building an entire device.

The above described one-transistor one-capacitor (1T1C) antifuse OTP memory cell 100 has one or more the following advantages. The high-voltage junction in conjunction with a low-voltage junction in the select transistor 110 can enable high voltage programming as well as smaller silicon area. The high voltage in conjunction with a low voltage junction in the antifuse capacitor 120 can improve programming yield.

In some embodiments, referring to FIGS. 2A and 2B, a one-transistor one-capacitor (1T1C) antifuse OTP memory cell 200 includes a select transistor 210 and an antifuse capacitor 220. The select transistor 210 includes a gate 215 on a gate dielectric 216 on a substrate 205. The antifuse capacitor 220 includes a gate 225 on a gate dielectric 226 on the substrate 205. The junctions (e.g. the source or the drain) of the select transistor 210 are formed respectively by lightly doped regions 211, 212 and the deeply doped regions 213, 214. The junctions (e.g. source or drain) of the antifuse capacitor 120 are formed respectively by lightly doped regions 221, 222 and the lightly doped regions 223, 224.

The combination of 211, 212 and 221, 222 lightly doped regions and deeply doped regions 213, 214 and 223, 224 is formed as the junction regions on both sides of the channel by applying the spacer structure 217, 227 between two doping processes.

The source/drain regions and the gates 215, 225 of the antifuse capacitor 220 and select transistor 210 are of the same conductivity type. The transistor channel region, i.e., the silicon substrate 205 underneath gate dielectric is of the opposite conductivity type. In the select transistor 210, for example, if the gate 215 and the source and the drain respectively formed by doped regions 211, 214 and 212, 213 are N type, the regions of the substrate 205 underneath the gate dielectric 216 is P type. Thus, the source/drain regions form PN junctions with the oppositely doped silicon substrate 205. Similarly, for the antifuse capacitor 220, if the gate 225, the junction formed by doped regions 221, 224, and the junction formed by doped regions 222, 223 are N type, the region of the substrate 205 underneath the gate dielectric 226 is P type.

The doped regions 211, 212 and 221, 222 are lightly doped, wherein the electrically active concentration of dopant level can be in a range of $3 \times 10^{17} \sim 1 \times 10^{19}$ atoms/cm$^{-3}$. The doped regions 213, 214 and 224, 223 formed on both sides of the channels are deeply doped, wherein the electrically active concentration of dopant level can be above $2 \times 10^{19}$ atoms/cm$^{-3}$.

Doped regions of 213, 212 are connected, and they are electrically conductive. Similarly, doping regions of 211, 214, 224, and 221 are connected, and they are electrically conductive. During antifuse programming, a voltage is applied on the gate 215 to turn on the select transistor 210, i.e., to form a conductive channel in the substrate underneath the gate dielectric 216. Meantime, a programming voltage is applied to the doped region 213. Through the conductive path, this programming voltage is actually applied on the gate dielectric 226 to cause a dielectric breakdown. A low electrical resistance will be measured between the gate 225 and the doping region 224.

Doped regions 211 and 214 form High Voltage (HV) junction with the substrate 205 for the select transistor 210. Doped regions 212 and 213 form Low Voltage (LV) junction with the substrate 205 for the select transistor 210. Doped regions 221 and 224 also form LV junction with the substrate 205 for the antifuse capacitor 220. Doped regions 222 and 223 form LV junction with the substrate 205 for the antifuse capacitor 220.

In order for transistor to function normally, the junction bias needs to be below junction breakdown voltage. For low voltage transistor, a shallower and steeper junction can be used without causing breakdown. Thus the device can have better short-channel behaviors. Formation of this kind of junction requires shallower implants, lower temperature and shorter anneals. For high voltage transistor, it is critical to avoid a peak junction electric field that may cause breakdown; therefore the junction profile must be adjusted accordingly. To avoid introducing a very high peak field at the junction, more gradual junction doping profiles are preferred. This usually means deeper implants, longer (maybe multiple) annealing steps. This kind of junctions consequently can handle higher bias voltages.

Figure 2C:
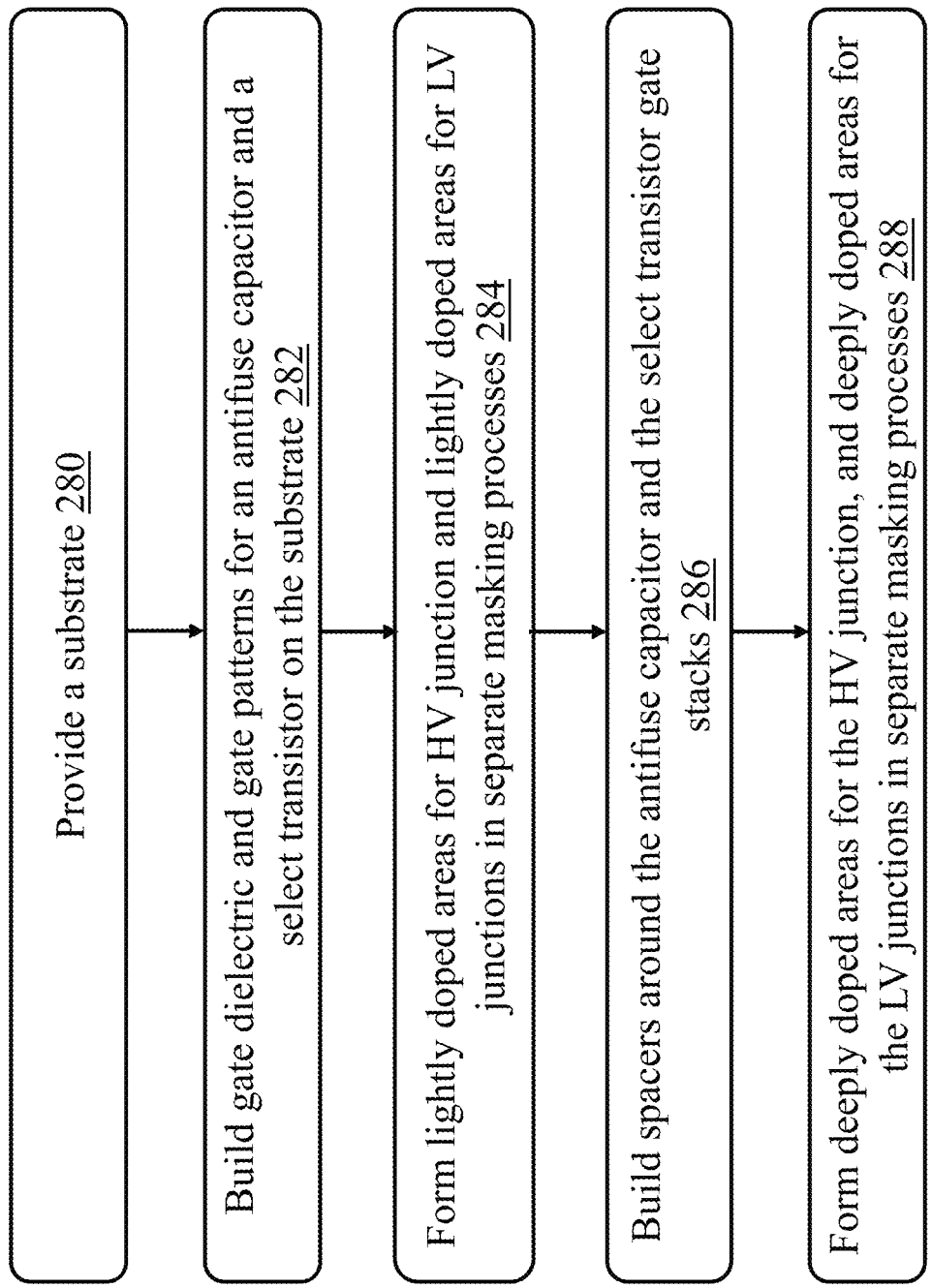
FIG. 2C is a process flow chart to build the one-transistor one-capacitor (1T1C) antifuse OTP memory cell shown in FIG. 2A.

Referring to FIG. 2C, a process to build the one-transistor one-capacitor (1T1C) antifuse OTP memory cell 200 can include the following steps. First to grow gate dielectric on a substrate (step 280). Gate dielectric and gate patterns for an antifuse capacitor and a select transistor on the substrate (step 282). A thin gate dielectric layer is formed on the substrate for the antifuse capacitor and a thicker gate dielectric layer is formed on the substrate for the select transistor. Then, the gate stacks are formed on top of the gate dielectric layers respectively. The antifuse capacitor and the select transistor are defined by masking and etching. The combination of lightly doped regions and deeply doped regions is formed by applying the spacer structure 217, 227 between two doping processes.

The shallowly doped regions (e.g. 211 in FIGS. 2A and 2B) for a HV junction and the shallowly doped regions (e.g. 212, 222, 221 in FIGS. 2A and 2B) for LV junctions are formed through separate masking and ion implants (step 284). As described above, annealing steps maybe added after dopant implant process, which can be tailored to form HV and LV junctions.

Building spacers around antifuse capacitor and select transistor gate stacks (step 286). Deeply doped region (214 in FIGS. 2A and 2B) for a HV junction, and deeply doped regions (213, 223, 224 in FIGS. 2A and 2B) for the LV junctions are formed in separate masking processes and ion implants (step 288).

In steps 282-288, the hybrid source and drain junctions can be formed in two step using different implantation conditions. For example, the more graduate junction can be first implanted using a high-voltage setting, followed by an implantation for the low-voltage junction setting. Two masking steps are needed, each exposing only one side of the source or the drain to the appropriate implantation. If necessary, an additional anneal can be added between the two implants. A possible sequence can be: mask the drain side→HV implant→anneal (optional)→mask the source side→low voltage implant→anneal.

The above described only serves as an example of process critical process steps to build a one-transistor one-capacitor (1T1C) antifuse OTP memory cell shown in FIGS. 2A-2B. Additional process steps maybe included between processes steps described above, and many process steps are needed before and after the processes steps described above for building an entire device.

The above described one-transistor one-capacitor (1T1C) antifuse OTP memory cell 200 has one or more the following advantages. The high-voltage junction in conjunction with a low-voltage junction in the select transistor 210 can enable high voltage programming as well as smaller silicon area.

Figure 3A:
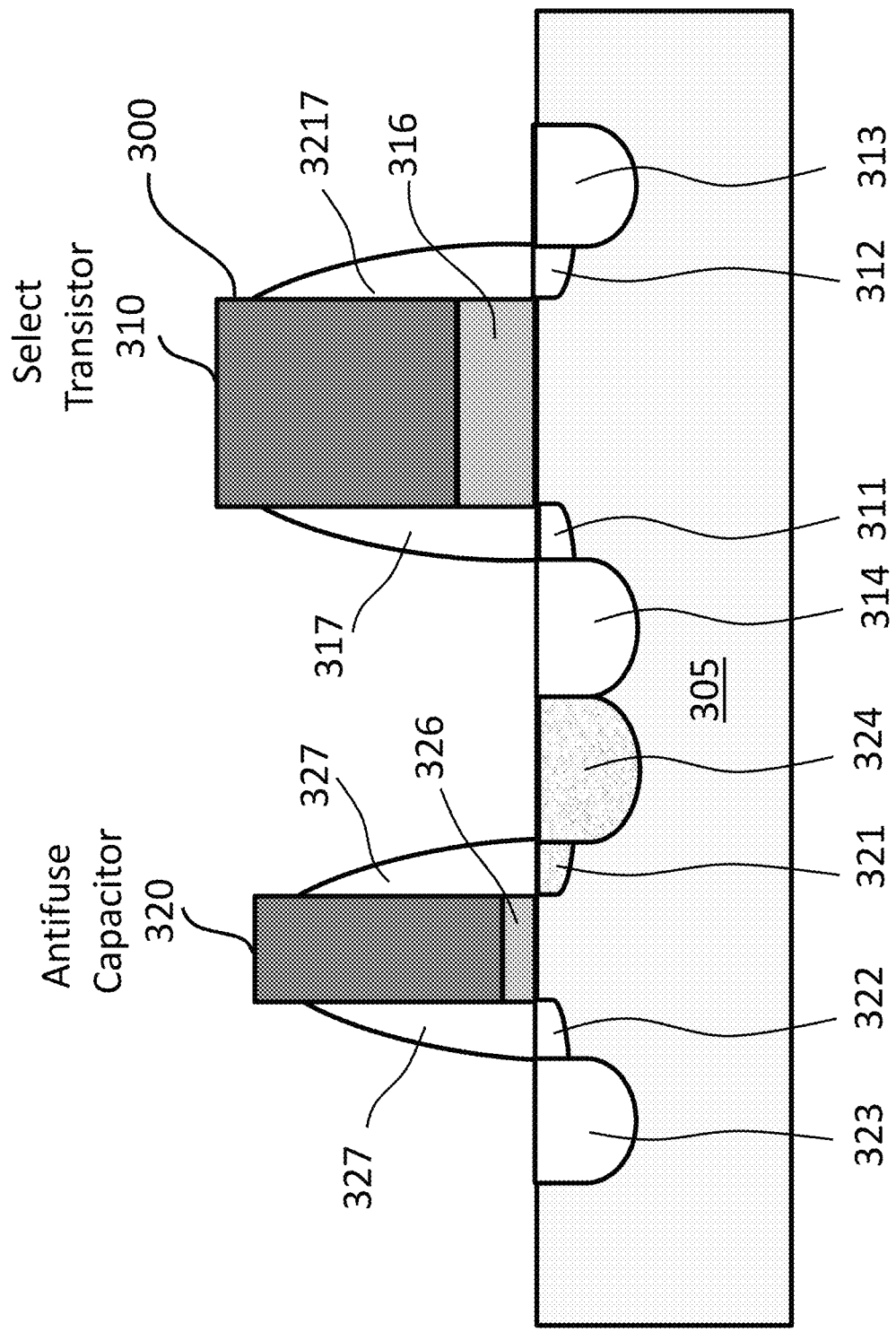
FIG. 3A is a cross-sectional view of the one-transistor one-capacitor (1T1C) antifuse OTP memory cell in accordance with some embodiments of the present invention.
Figure 3B:
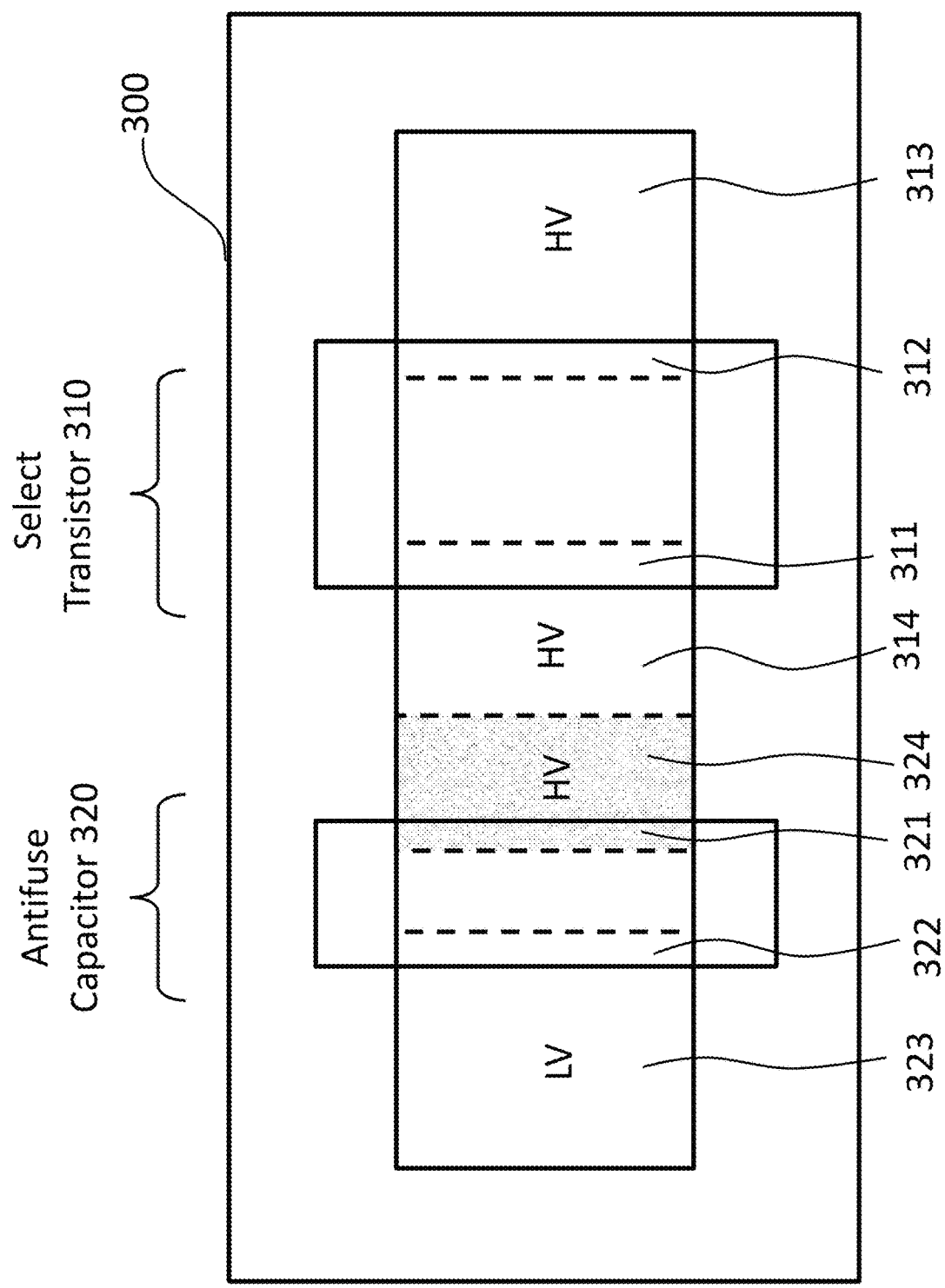
FIG. 3B is a schematic drawing of the one-transistor one-capacitor (1T1C) antifuse OTP memory cell shown in FIG. 3A.

In some embodiments, referring to FIGS. 3A and 3B, a one-transistor one-capacitor (1T1C) antifuse OTP memory cell in 300 includes a select transistor 310 and an antifuse capacitor 320. The select transistor 310 includes a gate 315 on a gate dielectric 316 on a substrate 305. The antifuse capacitor 320 includes a gate 325 on a gate dielectric 326 on the substrate 305. The combination of 311, 312 and 321, 322 lightly doped regions and deeply doped areas 313, 314 and 323, 324 is formed as the junction regions on both sides of the channel by applying the spacer structure 317, 327 between two doping processes.

The source/drain regions and the gates 315, 325 of the antifuse capacitor 320 and select transistor 310 are of the same conductivity type. The transistor channel region, i.e., the silicon substrate 305 underneath gate dielectric is of the opposite conductivity type. In the select transistor 310, for example, if the gate 315 and source/drain respectively formed by doped regions 311, 314 and 312, 313 are N type, the regions of the substrate 305 underneath the gate dielectric 316 is P type. Thus, the source/drain regions form PN junctions with the oppositely doped silicon substrate 305. Similarly, for the antifuse capacitor 320, if the gate 325 and source/drain respectively formed by doped regions 321, 324 and 322, 323 are N type, the region of the substrate 305 underneath the gate dielectric 326 is P type.

The doped regions 311, 312 and 321, 322 are lightly doped, wherein the electrically active concentration of dopant level can be in a range of $3 \times 10^{17} \sim 1 \times 10^{19}$ atoms/cm$^{-3}$. The doped regions 313, 314 and 324, 323 formed on both sides of the channels are deeply doped, wherein the electrically active concentration of dopant level can be above $2 \times 10^{19}$ atoms/cm$^{-3}$.

Doped regions of 313, 312 are connected, and they are electrically conductive. Similarly, doping regions of 311, 314, 324, and 321 are connected, and they are electrically conductive. During antifuse programming, a voltage is applied on the gate 315 to turn on the select transistor 310, i.e., to form a conductive channel in the substrate underneath the gate dielectric 316. Meantime, a programming voltage is applied to the doped region 313. Through the conductive path, this programming voltage is actually applied on the gate dielectric 326 to cause a dielectric breakdown. A low electrical resistance will be measured between the gate 325 and the doping region 324.

Doped regions 311 and 314 form a HV junction with the substrate 305 for the select transistor 310. Doped regions 312 and 313 also form a HV junction with the substrate 305 for the select transistor 310. Doped regions 321 and 324 also form a HV junction with the substrate 305 for the antifuse capacitor 320. Doped regions 322 and 323 form a LV junction with the substrate 305 for the antifuse capacitor 320.

In order for transistor to function normally, the junction bias needs to be below junction breakdown voltage. For low voltage transistor, a shallower and steeper junction can be used without causing breakdown. Thus the device can have better short-channel behaviors. Formation of this kind of junction requires shallower implants, lower temperature and shorter anneals. For high voltage transistor, it is critical to avoid a peak junction electric field that may cause breakdown; therefore the junction profile must be adjusted accordingly. To avoid introducing a very high peak field at the junction, more gradual junction doping profiles are preferred. This usually means deeper implants, longer (maybe multiple) annealing steps. This kind of junctions consequently can handle higher bias voltages.

Figure 3C:
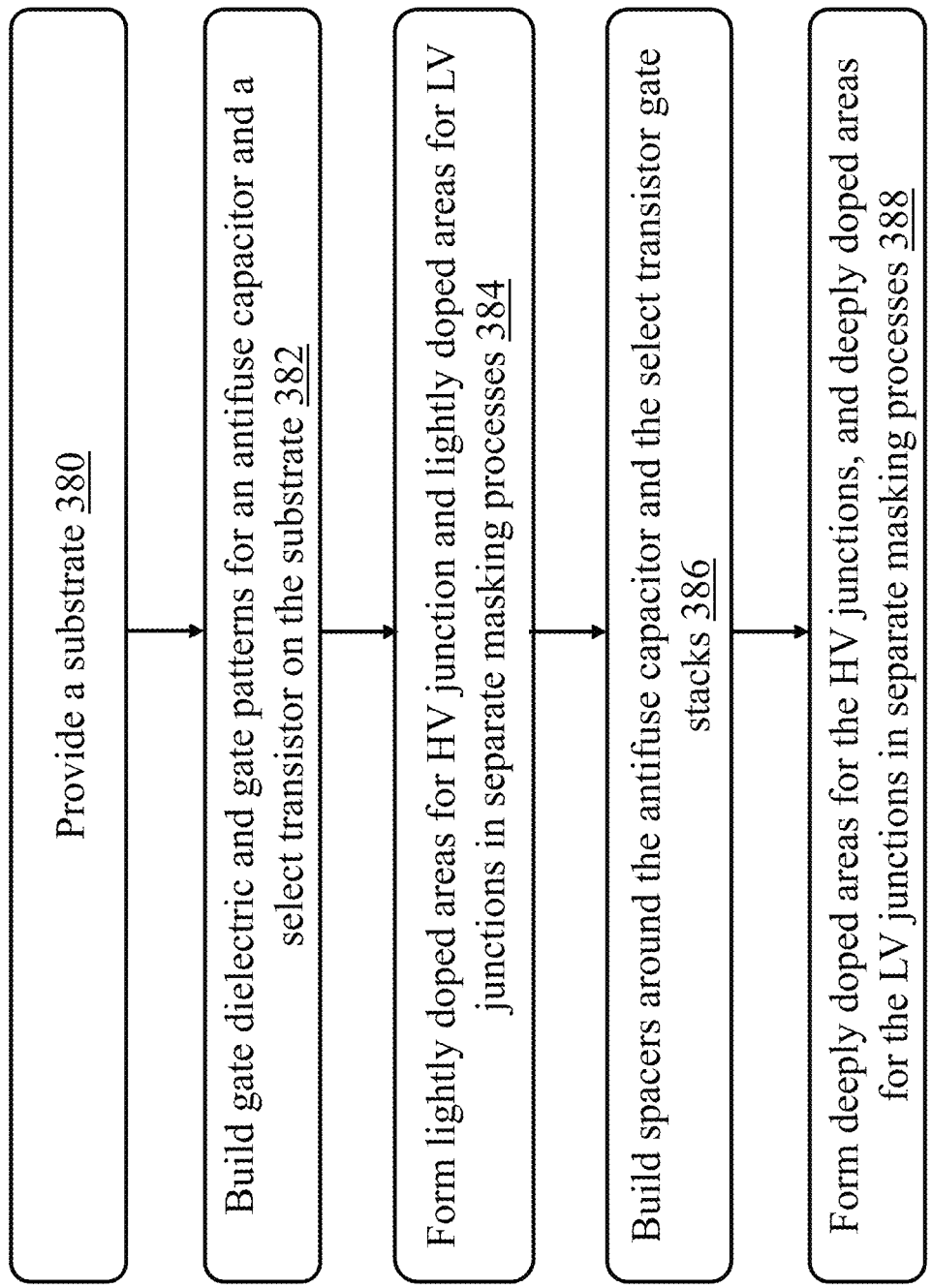
FIG. 3C is a process flow chart to build the one-transistor one-capacitor (1T1C) antifuse OTP memory cell shown in FIG. 3A.

Referring to FIG. 3C, a process to build the one-transistor one-capacitor (1T1C) antifuse OTP memory cell 300 can include the following steps. First to grow gate dielectric on a substrate (step 380). Gate dielectric and gate patterns for an antifuse capacitor and a select transistor on the substrate (step 382). A thin gate dielectric layer is formed on the substrate for the antifuse capacitor and a thicker gate dielectric layer is formed on the substrate for the select transistor. Then, the gate stacks are formed on top of the gate dielectric layers respectively. The antifuse capacitor and the select transistor are defined by masking and etching. The combination of lightly doped regions and deeply doped regions is formed by applying the spacer structure 317, 327 between two doping processes.

The shallowly doped regions (e.g. 311, 312, 321 in FIGS. 3A and 3B) for an HV junction and the shallowly doped regions (e.g. 322 in FIGS. 3A and 3B) for LV junctions are formed through separate masking and ion implants (step 384). As described above, annealing steps maybe added after dopant implant process, which can be tailored to form HV and LV junctions.

Building spacers around antifuse capacitor and select transistor gate stacks (step 386). Deeply doped region (313, 314, 324 in FIGS. 3A and 3B) for the HV junctions, and deeply doped regions (323 in FIGS. 3A and 3B) for the LV junctions are formed in separate masking processes and ion implants (step 388).

In steps 382-388, the hybrid source and drain junctions can be formed in two step using different implantation conditions. For example, the more graduate junction can be first implanted using a high-voltage setting, followed by an implantation for the low-voltage junction setting. Two masking steps are needed, each exposing only one side of the source or the drain to the appropriate implantation. If necessary, an additional anneal can be added between the two implants. A possible sequence can be: mask the drain side→HV implant→anneal (optional)→mask the source side→low voltage implant→anneal.

The above described only serves as an example of process critical process steps to build a one-transistor one-capacitor (1T1C) antifuse OTP memory cell shown in FIGS. 3A-3B. Additional process steps maybe included between processes steps described above, and many process steps are needed before and after the processes steps described above for building an entire device.

The above described one-transistor one-capacitor (1T1C) antifuse OTP memory cell 300 has one or more the following advantages. The high-voltage junction in conjunction with a low-voltage junction in the antifuse capacitor 320 can improve programming yield.

The above description of the disclosed embodiments enables those skilled in the art to implement or use the present invention. Various modifications to these embodiments will be readily apparent to those skilled in the art, and the general principles defined herein may be applied to other embodiments without departing from the spirit or scope of the invention. Thus, the present invention will not be limited to the embodiments shown herein but will conform to the widest scope consistent with the principles and novel features disclosed herein.

What is claimed is:

1. An antifuse One-Time-Programmable memory cell, comprising:
    a substrate;
    a select transistor formed on the substrate, wherein the select transistor includes:
        a first gate dielectric layer formed on the substrate,
        a first gate formed on the gate dielectric layer;
        a first high-voltage junction formed in the substrate; and
        a first low-voltage junction formed in the substrate,
    wherein a source and a drain for the select transistor are respectively formed by the first high-voltage junction and the first low-voltage junction, or respectively formed by the first low-voltage junction and the first high-voltage junction,
    wherein the first high-voltage junction has a first breakdown threshold voltage higher than the first low-voltage junction; and
    an antifuse capacitor formed on the substrate, wherein the antifuse capacitor includes:
        a second gate dielectric layer formed on the substrate,
        a second gate formed on the gate dielectric layer;

a second high-voltage junction formed in the substrate; and a second low-voltage junction formed in the substrate, wherein a source and a drain for the antifuse capacitor are respectively formed by the second high-voltage junction and the second low-voltage junction, or respectively formed by the second low-voltage junction and the second high-voltage junction, wherein the second high-voltage junction has a second breakdown threshold voltage higher than the second low-voltage junction.

2. The antifuse One-Time-Programmable memory cell of claim 1, wherein the first high-voltage junction or the second high-voltage junction has a threshold junction breakdown voltage above 3.3 Volt.

3. The antifuse One-Time-Programmable memory cell of claim 2, wherein the first high-voltage junction or the second high-voltage junction has a threshold junction breakdown voltage above 5 Volt.

4. The antifuse One-Time-Programmable memory cell of claim 1, wherein the first low-voltage junction or the second low-voltage junction has a threshold junction breakdown voltage below 3.2 Volt.

5. The antifuse One-Time-Programmable memory cell of claim 4, wherein the first low-voltage junction or the second low-voltage junction has a threshold junction breakdown voltage below 2.3 Volt.

6. The antifuse One-Time-Programmable memory cell of claim 1, wherein the first high-voltage junction and the second high-voltage junction are electrically connected.

7. The antifuse One-Time-Programmable memory cell of claim 1, wherein at least one of the first high-voltage junction or the second high-voltage junction includes two doped regions having different doping levels.

8. The antifuse One-Time-Programmable memory cell of claim 7, wherein the first high-voltage junction includes a first doped region adjacent to the first gate dielectric layer at a lower doped level than a second doped region away from the first gate dielectric layer.

9. The antifuse One-Time-Programmable memory cell of claim 7, wherein the second high-voltage junction includes a first doped region adjacent to the second gate dielectric layer at a lower doped level than a second doped region away from the second gate dielectric layer.

10. The antifuse One-Time-Programmable memory cell of claim 7, wherein one of the two doped regions has an electrically active concentration of dopant level in a range of $3 \times 10^{17} \sim 1 \times 10^{19}$ atoms/cm$^{-3}$, wherein another one of the two doped regions has an electrically active concentration of dopant level above $2 \times 10^{19}$ atoms/cm$^{-3}$.

11. The antifuse One-Time-Programmable memory cell of claim 1, wherein at least one of the first low-voltage junction or the second low-voltage junction includes two doped regions having different doping levels.

12. The antifuse One-Time-Programmable memory cell of claim 11, wherein the first low-voltage junction includes a first doped region adjacent to the first gate dielectric layer at a lower doped level than a second doped region away from the first gate dielectric layer.

13. The antifuse One-Time-Programmable memory cell of claim 11, wherein the second low-voltage junction includes a first doped region adjacent to the second gate dielectric layer at a lower doped level than a second doped region away from the second gate dielectric layer.

14. The antifuse One-Time-Programmable memory cell of claim 1, wherein the first high-voltage junction has a more gradual junction doping profiles than the first low-voltage junction, wherein the second high-voltage junction has a more gradual junction doping profiles than the second first low-voltage junction.

15. The antifuse One-Time-Programmable memory cell of claim 1, wherein the first high-voltage junction has a doping profiles annealed for a longer period than the first low-voltage junction, wherein the second high-voltage junction has a doping profiles annealed for a longer period than the second low-voltage junction.

* * * * *